United States Patent [19]

Chakravarti et al.

[11] 4,300,210
[45] Nov. 10, 1981

[54] CALIBRATED SENSING SYSTEM

[75] Inventors: Satya N. Chakravarti, Troy, N.Y.;
Lawrence G. Heller, South
Burlington; Wilbur D. Pricer,
Burlington, both of Vt.

[73] Assignee: International Business Machines Corp., Armonk, N.Y.

[21] Appl. No.: 108,242

[22] Filed: Dec. 27, 1979

[51] Int. Cl.³ .................. G11C 27/00; G11C 11/40; G11C 11/24
[52] U.S. Cl. ........................ 365/45; 365/149; 365/183
[58] Field of Search ............... 365/45, 75, 149, 183, 365/189

[56] References Cited

U.S. PATENT DOCUMENTS

| 3,387,286 | 6/1968 | Dennard | 365/149 |
| 3,764,906 | 10/1973 | Heller | 324/111 |
| 3,819,959 | 6/1974 | Chang et al. | 307/304 |
| 3,979,734 | 9/1976 | Pricer et al. | 365/149 |
| 3,993,917 | 11/1976 | Kalter | 307/238 |
| 4,035,667 | 7/1977 | Heller | 307/221 D |
| 4,040,017 | 8/1977 | Lee | 365/149 |
| 4,085,459 | 4/1978 | Hirabayashi | 365/75 |
| 4,137,464 | 1/1979 | Heller et al. | 307/221 D |
| 4,139,910 | 2/1979 | Anantha et al. | 365/183 |
| 4,181,865 | 1/1980 | Kohyama | 365/208 |
| 4,202,046 | 5/1980 | Ward | 365/75 |

OTHER PUBLICATIONS

Hiltebeitel et al., "Fractional Charge Packet Generator", IBM Tech. Disc. Bul., vol. 20, No. 8, 1/78, pp. 3014–3016.
Heald et al., "Multilevel Random Access Memory Using One Transistor Per Cell", IEEE Jour. of Solid-State Circuits, vol. SC-11, No. 4, 8/76, pp. 519–528.
Lee, "Converter for CCD Multilevel Shift Registers", IBM Tech. Disc. Bul., vol. 20, No. 8, 1/78, pp. 3011–3013.

Primary Examiner—Stuart N. Hecker
Attorney, Agent, or Firm—Stephen J. Limanek

[57] ABSTRACT

A calibrated sensing system is provided in accordance with the teachings of this invention for sensing charge in a storage medium, such as a storage capacitor, coupled to an access or bit/sense line which compensates for most sources of variability in the storage medium and in the access line. In the system, the unknown charge stored in the storage medium is transferred to a first capacitor or potential well via the access line. A high charge state of the storage medium is written into the storage medium and known fractional packets of charge are prepared therefrom, transferred selectively to a second capacitor or potential well and compared with the unknown charge in the first potential to determine the relative level of the unknown charge that was stored in the storage medium. By selectively using two or more fractional packets of charge multilevel sensing is performed.

21 Claims, 6 Drawing Figures

CALIBRATED SENSING SYSTEM

TECHNICAL FIELD

This invention relates to integrated semiconductor circuits and more particularly to circuits for sensing data stored in a storage medium preferably of the type having a continuum of states such as in a capacitor.

BACKGROUND ART

Integrated semiconductor memory circuits, particularly those employing cells which include essentially only a storage capacitor and a switch, have achieved high densities. One of the simplest circuits for providing small memory cells is described in commonly assigned U.S. Pat. No. 3,387,286, filed July 14, 1967, by R. H. Dennard, wherein the switch is a single field effect transistor.

In commonly assigned U.S. Pat. No. 3,979,734, filed June 16, 1975, by W. David Pricer and J. E. Selleck, there is described a memory array made of small cells each of which employs a storage capacitor and a single bipolar transistor. In this memory array, which is word organized, each storage capacitor of these cells has one capacitor terminal connected to a separate bit/sense line to provide a fast, dense bipolar memory.

In another commonly assigned U.S. Pat. No. 4,040,017, filed Mar. 31, 1976, by H. S. Lee, there is disclosed a capacitor memory produced in a unipolar technology which is provided with very small cells, each of which includes substantially only a storage capacitor having a bit/sense line connected to one terminal of the capacitor and a word line providing a coupling to the other terminal of the capacitor.

In still another commonly assigned U.S. Pat. No. 3,819,959, filed Dec. 4, 1970, by J. J. Chang and J. W. Sumilas, there is disclosed a very dense memory having cells connected serially as in a shaft register. This memory which has very small cells is operated so as to continuously transfer packets of charge representative of data from one cell to an adjacent cell until the charge reaches an output terminal. This type of memory is commonly called a charge coupled or charge transfer device memory.

Since only a very small charge is contained in each cell of these dense memories, sensing systems used to detect the charge must of necessity be very sensitive charge or voltage detectors to distinguish between different binary bits of data stored in the cells.

An amplifier which has been found to be very suitable for detecting small signals, particularly in the cells which employ a storage capacitor and a field effect transistor, as disclosed in the above identified U.S. Pat. No. 3,387,286, is described in commonly assigned U.S. Pat. No. 3,993,917, filed May 29, 1975, by H. L. Kalter. This amplifier includes a pair of cross-coupled field effect transistor devices coupled to a pair of bit/sense lines by clock signal responsive switching devices and is process parameter independent.

Another detecting system which has been found to be very suitable for detecting very small charges or voltages in memory cells is described in commonly assigned U.S. Pat. No. 3,764,906, filed Oct. 1, 1971, by L. G. Heller. In this detecting system the amount of charge stored in a charge storage medium is transferred with negligible loss from the storage medium to a charge detector without regard to the size of any distributed or parasitic capacitance present on the lines, such as on a bit line.

In order to provide memory systems which have even more dense storage of information than in the memories disclosed hereinabove, memories have been provided wherein the storage capacity is increased by utilizing multiple levels of charge in a given cell to simultaneously represent two or more digits of information. In these multilevel charge storage memories, the storage medium may store N bits of information, where N is equal to 2, 3 or more and where the number of levels is equal to $2^N$. A charge coupled device memory of this type is disclosed in commonly assigned U.S. Pat. No. 4,139,910, filed Dec. 6, 1976, by N. G. Anantha, F. Y. Chang and B. J. Rubin.

In an article entitled "Multilevel Random-Access Memory Using One Transistor Per Cell" by R. A. Heald, et. al., in *IEEE Journal of Solid-State Circuits*, Vol. SC-11, No. 4, August 1976, pp. 519 through 528, there is described a multilevel random access memory which uses junction field effect transistors, with current sensing for the detection of the information stored in these cells.

In the prior art many circuits are known for handling with precision small quantities of charge. For example, in commonly assigned U.S. Pat. No. 4,035,667, filed Dec. 2, 1975, by L. G. Heller, there is described an integrated circuit for inserting charge packets into a charge transfer device, in commonly assigned U.S. Pat. No. 4,137,464, filed Aug. 16, 1977, by L. G. Heller and L. M. Terman there is disclosed a technique for producing charge packets having values $Q/2$, $Q/4$, $Q/8$ . . . $Q/2^N$ where Q is the original size of the charge packet and N is an integer, and in an article entitled "Convertor for CCD Multilevel Shift Registers" by H. S. Lee, in *IBM Technical Disclosure Bulletin* Vol. 20, No. 8 January 1978, pp. 3011-3013, there is described another system for producing fractional charge packets which may be used in memory systems.

DISCLOSURE OF INVENTION

It is an object of this invention to provide an improved sensing system, and in particular an improved sensing system wherein the storage medium is calibrated prior to sensing.

It is another object of this invention to provide a calibrated sensing system for sensing data in a storage medium having a continuum of states therein, such as in known dynamic or read mostly memories.

It is still another object of this invention to provide an improved calibrated sensing system for sensing data in a storage medium having a very small capacitor.

It is yet another object of this invention to provide a calibrated sensing system having a very small capacitor of unknown size.

It is a further object of this invention to provide a calibrated sensing system for a memory array having very small storage capacitors wherein the size of the capacitors varies within the memory array.

It is yet a further object of this invention to provide a storage cell sensing system which calibrates the cell so that the size of the storage capacitor is immaterial, that is, the sensed signals produced by the system are independent of the size of the storage capacitor.

It is still a further object of this invention to provide a calibrated sensing system for detecting multilevels of charge in a small storage medium wherein each level represents at least two binary digits of information.

In accordance with the teachings of this invention, a sensing system is provided for sensing charge in a storage medium, such as a storage capacitor, coupled to an access line by compensating for most sources of variability in the storage medium and in the access line. In the system, the access line is brought to a given voltage level and is permitted to float electrically. The unknown charge $Q_X$ stored in the storage medium is transferred to a first capacitor or potential well via the access line. The high charge state $Q_H$ of the storage medium is written into the storage medium and transferred to a second capacitor or potential well via the access line. Fractional packets of charge $Q_H$ are prepared and compared with the unknown charge $Q_X$ to determine the relative level of the unknown charge $Q_X$ that was stored in the storage medium.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
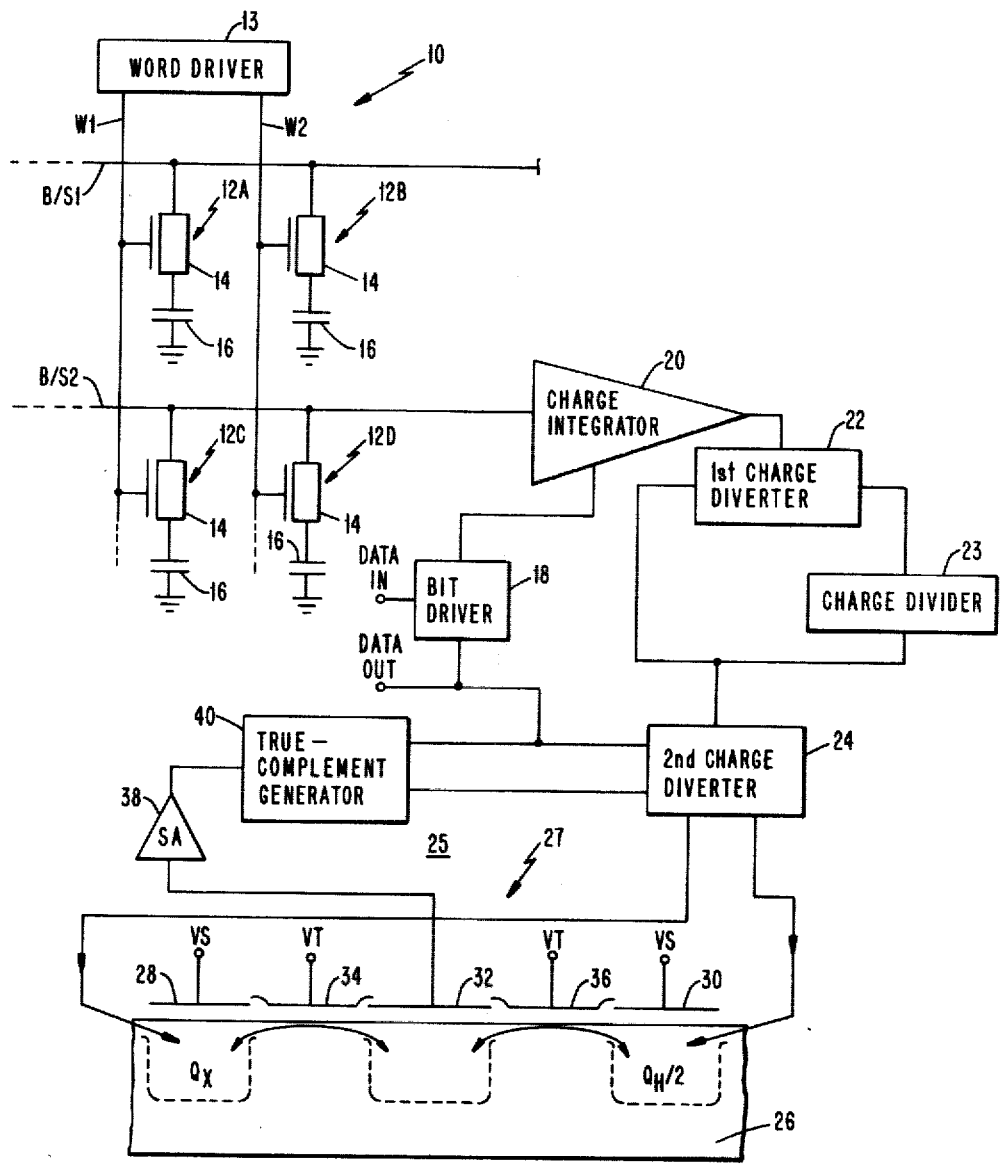
FIG. 1 is a circuit of the sensing system of the present invention shown generally in block form.

Referring to FIG. 1 of the drawing in more detail, there is illustrated a circuit of the sensing system of the present invention primarily in block form coupled to a memory array 10 of the type described, for example, in the above identified Dennard patent. The array includes first and second word lines W1 and W2, respectively, and first and second bit/sense lines B/S1 and B/S2, respectively. Memory cells 12A and 12B are connected to the first bit/sense line B/S1 and are controlled by the first and second word lines W1 and W2, respectively, and memory cells 12C and 12D are connected to the second bit/sense line B/S2 and are also controlled by the first and second word lines W1 and W2, respectively. A word driver 13 of any known suitable type is connected to the word lines W1 and W2. Each of the memory cells 12A, 12B, 12C and 12D includes a field effect transistor 14 and a storage capacitor 16.

Connected to each bit line of the memory array 10 is the sensing system of the present invention illustrated, in the interest of clarity, as being connected only to the second bit/sense line B/S2. A bit driver 18 has an output connected to the bit/sense line B/S2 via a charge integrator 20 and an input connected to the data in terminal. A second input terminal to bit driver 18 is connected to the data out terminal of the sensing system of the present invention. The sensing system includes the charge integrator 20 having its input connected to the bit/sense line B/S2 and its output connected to a first charge diverter 22 which has a first output connected directly to a second charge diverter 24 and a second output connected to the second charge diverter 24 through a charge divider 23. The second charge diverter 24 is coupled to a signal detecting circuit 25 including a floating gate sensor 27, a sense amplifier 38 and a true-complement generator 40. The second charge diverter 24 has first and second outputs coupled to first and second potential wells in a semiconductor substrate 26 formed under and by storage electrodes 28 and 30, respectively, of the floating gate sensor 27. A third potential well formed by and under storage electrode 32 is disposed between storage electrodes 28 and 30. A charge transfer electrode 34 is disposed between storage electrodes 28 and 32 and a charge transfer electrode 36 is disposed between storage electrodes 30 and 32. Although not illustrated in the drawing, it should be understood that the storage and transfer electrodes are separated from the surface of the semiconductor substrate 26 by a suitable layer of insulation, as is well known in the charge coupled device technology. Furthermore, preferably, the storage electrodes are made from a first layer of doped polysilicon and the transfer electrode are made from a second layer of doped polysilicon in a known manner.

Storage electrode 32 which forms the third potential well is connected to the input of the sense amplifier 38, which may be of the latch type, having its output connected to the input of the true-complement generator 40. The complementary output from the true-complement generator 40 is connected to the second charge diverter 24 to control the diverter output, with one of the outputs of the true-complement generator 40 being connected to the data out terminal.

Figure 2:
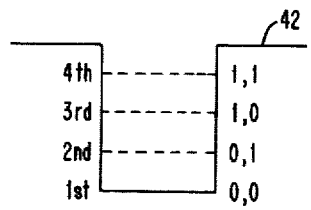
FIG. 2 illustrates a charge storage medium indicating different levels of charge stored therein.

FIG. 2 illustrates symbolically a charge storage medium which sequentially stores charge at four different levels, the first or lowest level being indicated at 0,0, the second level being 0,1, the third level being 1,0, and fourth or highest level being 1,1, with the difference in charge between levels being substantially equal. The first level indicates the storage of two binary digits 0,0 of information, the second level indicating the storage of a 0 and a 1, with the 0 being the first bit and the 1 being the second bit, the third level indicating a 1 and a 0, with the 1 being the first bit and the 0 being the second bit, and the fourth or highest level storing two 1 bits of information.

In explaining the operation of the circuit of FIG. 1, it will be assumed that an unknown charge $Q_X$ stored in storage capacitor 16 of memory cell 12D is to be sensed and that a charge $Q_H$ is the charge stored in storage capacitor 16 at the highest charge level, i.e., when a 1 and a 1 are stored therein. By precharging bit/sense line B/S2 to a predetermined voltage and by applying a word pulse from word driver 13 to word line W2, the unknown charge $Q_X$ in storage capacitor 16 of cell 12D is transferred into the charge integrator 20, as is known in the prior art. The unknown charge $Q_X$ is transferred through the first transfer diverter 22 directly into the second charge diverter 24 and then into the potential well in semiconductor substrate 26 under storage electrode 28. To calibrate the storage capacitor 16 of cell 12D, a voltage having a magnitude sufficient to store the highest charge $Q_H$, i.e., at the fourth or 1,1 level, in storage capacitor 16 of cell 12D is applied to bit/sense line B/S2 via the data in terminal, the bit driver 18 and the charge integrator 20. This charge $Q_H$ is then read out of cell 12D and stored in charge divider 23. By operating the charge divider 23 in a known manner, a charge equal to $Q_H/2$ is produced and transferred through the second charge diverter 24 to the second potential well in semiconductor substrate 26 formed under storage electrode 30.

To sense the first or most significant bit in charge $Q_X$, the input potential in sense amplifier 38 is placed at a fixed value, for example, +8 volts, and the charge in the first potential well under storage electrode 28 is transferred into the third potential well under storage electrode 32. After all of the charge from the first potential well under storage electrode 28 is transferred into the third potential well under storage electrode 32, storage electrode 32 is permitted to float electrically and the charge in the third potential well under storage electrode 32 is transferred back into the first potential well under storage electrode 28. This transfer of charge causes the potential on storage electrode 32 to increase by an amount depending upon the amount of charge transferred from the third potential well into the first potential well. This potential or voltage can be assumed to increase to, e.g., 8.2 volts. With storage electrode 32 still floating the charge $Q_H/2$ is now transferred from the second potential well under storage electrode 30 into the third potential well under storage electrode 32. If after the charge $Q_H/2$ is transferred from the second potential well under storage electrode 30 into the third potential well under storage electrode 32, the voltage on the floating storage electrode 32 remains higher than 8 volts, i.e., a $+\Delta V$ is produced, the first digit stored in the storage capacitor 16 of memory cell 12D was a 1 bit of information. To determine the second bit of information stored in storage capacitor 16 of cell 12D a charge $Q_H/3$ is produced in charge divider 23 and transferred through the second charge diverter 24 into the second potential well under storage electrode 30. The second bit is sensed by repeating the procedure used to sense the first bit. If after both charge packets $Q_H/2$ and $Q_H/3$ are transferred into the third potential well under storage electrode 32 and the voltage at the floating storage electrode 32 remains above +8 volts, i.e., it has a $+\Delta V$ voltage, the second digit stored in storage capacitor 16 of cell 12D is also as 1. However, if the voltage on floating storage electrode 32 decreased to a value below +8 volts, i.e., if a $-\Delta V$ voltage is produced, the second significant digit is a 0.

If, immediately after the charge $Q_H/2$ had been transferred from the second potential well to the third potential well, a $-\Delta V$ voltage had been produced on the floating storage electrod 32, i.e., if the voltage on electrode 32 had decreased to a voltage less than +8 volts, then the first digit stored in the storage capacitor 16 of cell 12D would have been a 0. To determine the second digit when the first digit has been determined to be a 0, the charge packet $Q_H/3$ produced by charge divider 23 is transferred through the second charge diverter 24 into the first potential well produced by storage electrode 28. When this situation occurs the charge $Q_H/2$ stored in the third potential well is transferred back to the second potential well under storage electrode 30 and the two charge packets $Q_X$ and $Q_H/3$ in the first potential well of the storage electrode 28 are transferred into the third potential under storage electrode 32 with the storage electrode 32 being held at its fixed potential of +8 volts. Then, with the storage electrode 32 being placed in its floating condition, the charge in the third potential well is transferred back into the first potential well to again cause an increase in the potential on floating storage electrode 32. The charge $Q_H/2$ in the second potential well under storage electrode 30 is now again transferred into the third potential well under floating storage electrode 32. If the potential on storage electrode 32 remains above +8 volts, i.e., a $+\Delta V$ voltage is produced, the second digit stored in the storage capacitor 16 of cell 12D was a 1. If the voltage on floating storage electrode 32 decreases to a voltage less than 8 volts, i.e., a $-\Delta V$ voltage, is produced, the second digit is also a 0.

It should be noted that with the output of the sense amplifier 38 connected to the true-complement generator 40, the output of the true-complement generator 40 automatically directs the charge packet $Q_H/3$ into the appropriate potential well, i.e., into the first potential well under storage electrode 28 when the first digit is a 0 and into the second potential well under storage electrode 30 when the digit is a 1.

Although the sensing system of the present invention as illustrated in FIG. 1 has been described in connection with storage simultaneously of two binary digits of information in a storage capacitor of a memory cell in the array 10, it should be understood that the invention operates in a similar manner when three digits are stored at one time in a particular cell of the array 10. To store simultaneously three digits of information in a memory cell, eight levels of charge are produced for each memory cell and the charge divider 23 produces a charge packet equal to $4/7Q_H$ rather than $Q_H/3$ and an additional packet of charge equal to $2/7Q_H$, which packets are directed by the second charge diverter 24 into either the first potential well under storage electrode 28 or into the second potential well under storage electrode 30 depending upon whether the previously sensed bit was a 0 or a 1, as described hereinabove in connection with the storage simultaneously of two binary digits of information.

Referring to the operation of the circuit of the present invention in more detail, it can be seen that the first or lowest level of charge in storage capacitor 16 is zero charge and with charge levels separated by, e.g., two units of charge, the fourth or highest level of charge $Q_H$ is equal to six units of charge, as indicated in FIG. 2 of the drawings. Thus, the charge $Q_H/2$ is equal to 3 units and the charge $Q_H/3$ is equal to 2 units. When the first level of charge, at 0,0, is being sensed, i.e., when $Q_X=0$ charge, the charge in the first potential well is 0 units and, therefore, the 3 units of charge transferred from the second potential well to the third potential well produces a $-\Delta V$ voltage to indicate the first digit as a 0. With the 2 units of charge now added to the first potential well, the 3 units of charge transferred from the second potential well to the third potential well again produces a $-\Delta V$ voltage to indicate that the second digit is also a zero.

When the second level of charge, at 0,1, is being sensed, i.e., when $Q_X=2$ units of charge, the charge in the first potential well is 2 units and, therefore, the 3 units of charge transferred from the second potential well to the third well produce a $-\Delta V$ voltage to indicate the first digit as a 0. With the 2 units of charge added to the first potential well along with the 2 units to equal 4 units, the 3 units of charge transferred from the second potential well to the third potential well produces a $+\Delta V$ voltage to indicate that the second digit is a 1.

When the third level of charge, at 1,0, is being sensed, i.e., when $Q_X=4$ units of charge, the charge in the first potential well is 4 units and, therefore, the 3 units transferred from the second potential well to the third potential well produce a $+\Delta V$ voltage to indicate that the first digit is a 1. With no further charge added to the first potential well but with the 2 units of charge now being added to the second potential well along with the 3 units to equal 5 units, the 5 units of charge transferred from the second potential well to the third potential well produce a $-\Delta V$ voltage to indicate that the second digit is a 0.

When the fourth level of charge, at 1,1, is being sensed, i.e., when $Q_X=6$ units of charge, the charge in the first potential well is 6 units and, therefore, the 3 units transferred from the second potential well to the third potential well produce a $+\Delta V$ voltage to indicate that the first digit is a 1. With no further charge added to the first potential well but with the 2 units now added to the second potential well along the 3 units to equal 5 units, the 5 units transferred from the second potential well to the third potential well again produce a $+\Delta V$ voltage to indicate that the second digit is also a 1.

It is to be understood that the first and second potential wells are produced by applying an appropriate voltage VS to storage electrodes 28 and 30, and the transfer of charge into and out of the third potential well is controlled by applying an appropriate voltage VT to transfer electrodes 34 and 36, as is well known.

Accordingly, it can be seen that by employing the calibrated sensing system of the present invention, signals in a storage medium of the dynamic memory type are readily sensed even where each signal represents more than one digit of information.

Figure 3:
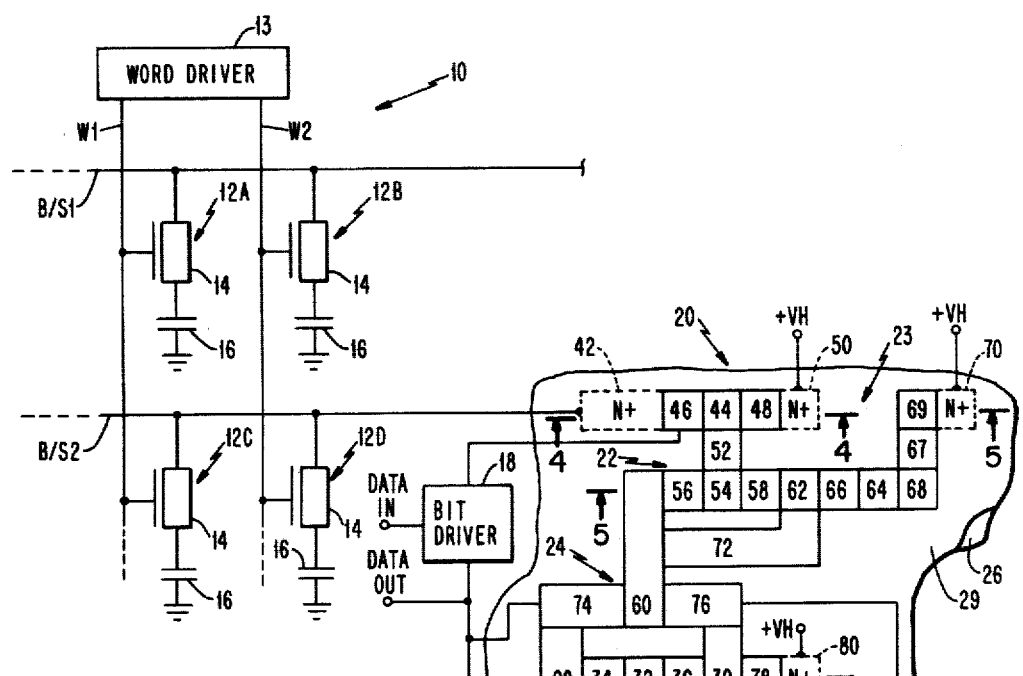
FIG. 3 is a circuit diagram similar to the circuit of FIG. 1 but shown in more detail.

FIG. 3 is a circuit diagram similar to the circuit of FIG. 1 but shown in more detail. The bit/sense line B/S2 is connected to charge integrator 20 which includes an N+ diffusion 42, a storage electrode 44, first and second transfer electrodes 46 and 48 and an N+ diffusion 50. The N+ diffusion 42, formed in substrate 26 which is covered with a layer of insulation 29, is connected directly to the bit/sense line B/S2 and the N+ diffusion 50 is connected to a source of voltage +VH which acts as an electron drain for the integrator 20. The charge integrator 20 is coupled to the first charge diverter 22 through a transfer electrode 52. The first charge diverter 22 includes a storage electrode 54 and first and second transfer electrodes 56 and 58. A first output of the first charge diverter 22 is connected to the second charge diverter 24 through a transfer electrode 56 and a second output of the first charge diverter 22 is coupled to the charge divider 23 through a charge transfer electrode 58. The charge divider 23 includes storage electrode 62, 64, and 67, transfer electrodes 66, 68 and 69 and an N+ diffusion 70. The N+ diffusion 70 is connected to a voltage source +VH and acts as an electron drain for the charge divider 26. The storage electrode 62 of charge divider 23 is coupled to a storage electrode 60 of the second charge diverter 24 through a transfer electrode 72. The second charge diverter 24, in addition to including the storage electrode 60, also has first and second transfer electrodes 74 and 76. First and second outputs from the second charge diverter 24 are applied to the floating gate sensor 27 of the signal detecting circuit 25 which also includes the sense amplifier 38 and the true-complement generator 40. The floating gate sensor 27 includes the first, second and third storage electrodes 28, 30 and 32 and the transfer electrodes 34 and 36, as described hereinabove in connection with FIG. 1 of the drawings. Additionally, a transfer electrode 78 is provided to couple the floating gate sensor 27 to an N+ diffusion 80 which is connected to a voltage source +VH, acting as an electron drain. The output from the floating gate sensor 27 is at storage electrode 32 which is connected to the input of sense amplifier 38, with the output of the sense amplifier 38 being connected to the input of the true-complement generator 40. One output from the true-complement generator 40 is connected to the data out terminal and an input to bit driver 18 and also to the second charge diverter 24 at the transfer electrode 74. The second output of the true-complement generator 40 is connected to the second charge diverter 24 at the transfer electrode 76.

Figure 4:
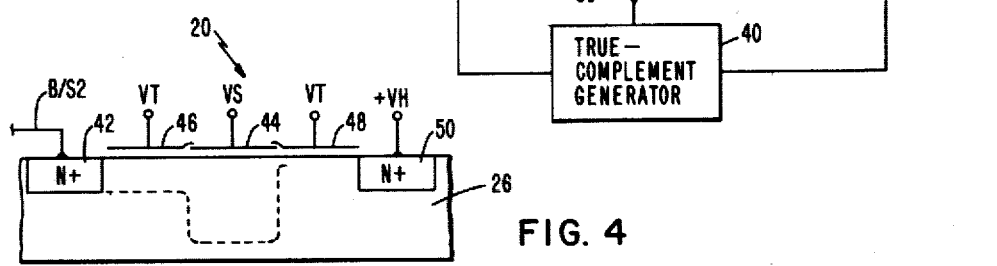
FIG. 4 is a sectional view of the circuit of FIG. 3 taken through line 4—4 thereof.

FIG. 4 is a sectional view of the integrator 20 of the circuit of FIG. 3 taken through line 4—4 thereof.

Figure 5:
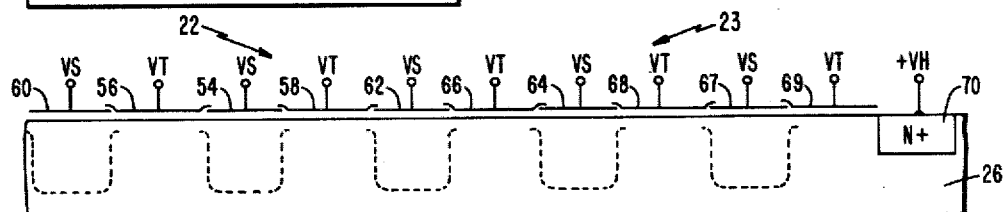
FIG. 5 is a sectional view of the circuit of FIG. 3 taken through line 5—5 thereof.

In FIG. 5 of the drawing, there is illustrated a sectional view of the first charge diverter 22 and the charge divider 23 of the circuit of FIG. 3 taken through line 5—5 thereof.

Figure 6:
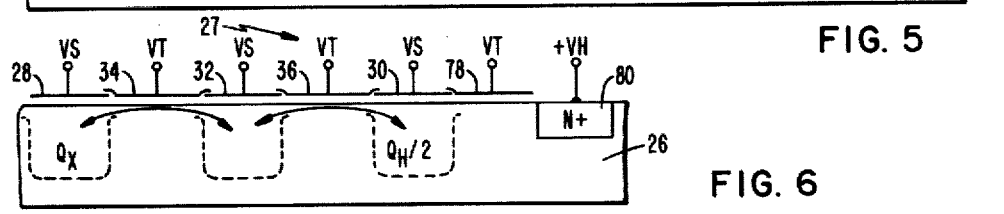
FIG. 6 is a sectional view of the circuit of FIG. 3 taken through line 6—6 thereof.

FIG. 6 is a sectional view of the floating gate sensor 27 of the circuit of FIG. 3 taken through line 6—6 thereof.

The circuit of FIG. 3 of the drawing operates in a manner similar to that described hereinabove in connection with the operation of FIG. 1 of the drawing. A voltage VT is applied to the transfer electrode 46 to apply a voltage on the bit/sense line B/S2 having a predetermined voltage equal to the voltage VT minus a threshold voltage. When the charge from storage capacitor 16 of memory cell 12D is applied to the bit/sense line B/S2 after a word pulse is applied to word line W2, an equal amount of charge is directed to the potential well under storage electrode 44, indicated more clearly in FIG. 4 of the drawing. The charge in the potential well under storage electrode 44 is transferred to the potential well under storage electrode 54 of the first charge inverter through transfer electrode 52. If the charge in the potential well under storage electrode 54 is the unknown charge $Q_X$, it is then directed through transfer electrode 56 into the potential well formed by storage electrode 60 of diverter 24, indicated more clearly in FIG. 5 of the drawings. On the other hand if the charge in the potential well under storage electrode 54 is the high charge $Q_H$, the charge $Q_H$ is directed to the storage electrode 62 of the charge divider 23 through the transfer electrode 58, as also indicated more clearly in FIG. 5 of the drawings. By operating the charge divider 23 in a known manner, the desired fractional charge packets are formed and are then directed from the storage electrode 62 to the storage electrode 60 of the second charge diverter 24 through the transfer electrode 72.

The charge in the potential well under the storage electrode 60 of the second charge diverter 24 is then transferred to the floating gate sensor 27 of the signal detecting circuit 25, in the manner described hereinabove in connection with the operation of the circuit of FIG. 1 of the drawing. Charge from the potential well under storage electrode 60 of the second charge diverter 24 is transferred through the transfer electrode 74 to the first potential well under the storage 28 of the floating gate sensor 27 and through the transfer electrode 76 to the second potential well under the storage electrode 30. To determine the data represented by the charge $Q_X$, the signal detecting circuit 25 is operated in the same manner as was described hereinabove in connection with the operation of the signal detecting circuit 25 of FIG. 1 of the drawings.

It should be noted, as is known, to obtain the fractional charge packet $Q_H/2$, only two potential wells, such as the wells formed by storage electrodes 62 and 64, are merged and then separated by a transfer electrode, such as transfer electrode 66. To obtain the fractional charge packet $Q_H/3$, three potential wells, such as the wells formed by storage electrodes 62, 64 and 67, are merged to distribute the charge $Q_H/2$ equally among the three wells by transfer electrodes 66 and 68, and then the charge in two of these wells is retained and transferred to the floating gate sensor 25.

It should also be noted that the N+ diffusion 50 in the integrator 20, the N+ diffusion 70 in charge divider 23 and the N+ diffusion 80 in the floating gate sensor 27 are operated under the control of transfer electrodes 48, 69 and 78, respectively, to clear the circuit of any unwanted charge, such as at the end of each cell reading cycle.

Although the memory array 10 has been illustrated for purposes of clarity as being only a 2 by 2 or four cell array, it should be understood that the array may include one hundred or more word and bit/sense lines coupled to many thousands of cells.

While the invention has been particularly shown and described with reference to preferred embodiments thereof, it will be understood by those skilled in the art that various changes in form and details may be made therein without departing from the spirit and scope of the invention.

What is claimed is:

1. A system for sensing an unknown charge representative of first and second digits stored in a charge storage medium having a given high charge state comprising
   a charge detecting circuit having first and second storage mediums and means for comparing relative amounts of charge in said first and second storage mediums,
   means for transferring said unknown charge into said first storage medium,
   means for introducing charge into said charge storage medium to said high charge state,
   charge dividing means for forming fractional packets of charge of said high state charge,
   means for transferring said high state charge to said charge dividing means,
   means for transferring a first given fractional packet of charge from said charge dividing means to said second storage medium in said charge detecting circuit, and
   means for transferring a second given fractional packet of charge from said charge dividing means to one of said first and second storage mediums of said charge detecting circuit depending upon the relative value of said unknown charge to said first given fractional packet of charge.

2. A system for sensing an unknown charge stored in a charge storage medium having a given high charge state comprising
   first and second charge storage means,
   means for transferring said unknown charge to said first charge storage means,
   means for storing charge in said charge storage medium to said high charge state,
   means for selectively transferring known fractional charge packets of said high state charge to said first and second charge storage means, and
   means for comparing said unknown charge with said known fractional charge packets of the high state charge to determine said unknown quantity of charge.

3. A system for sensing an unknown charge stored in a charge storage medium having a given high charge state comprising
   first and second charge storage means,
   means for transferring sad unknown charge to said first charge storage means,
   means for storing charge in said charge storage medium to said high charge state,
   means for selectively transferring known fractional charge packets of said high state charge to said first and second charge storage means, and
   means for comparing said unknown charge with said known fractional charge packets of the high state charge to determine said unknown quantity of charge, said comparing means comparing said unknown charge with a first known fractional charge packet to determine a first relative value of unknown charge to the charge in the first packet and with a second known fractional charge packet to determine another relative value of the unknown charge to the charge in the second packet.

4. A system as set forth in claim 3 wherein said charge storage medium is a capacitor and said first and second charge storage means include a semiconductor substrate having first and second potential wells.

5. A system as set forth in claim 4 wherein said means for transferring said high state charge includes an integrator and a first charge diverter.

6. A system as set forth in claim 5 wherein said means for transferring said unknown charge includes a second charge diverter.

7. A system for sensing an unknown charge stored in a charge storage medium having a given high charge state comprising
   first and second charge storage means,
   means for transferring said unknown charge to said first charge storage means,
   means for storing charge in said charge storage medium to said high charge state,
   means for selectively transferring known fractional charge packets of said high state charge to said first and second charge storage means, and
   means including a floating gate sensor for comparing said unknown charge with said known fractional charge packets of the high state charge to determine said unknown quantity of charge.

8. A system as set forth in clam 7 wherein said floating gate sensor includes a semiconductor substrate and a storage electrode insulated from said substrate and said comparing means further includes a sense amplifier having an input connected to said storage electrode.

9. A system as set forth in clam 8 wherein said comparing means further includes a true-complement generator having an input coupled to the output of said sense amplifier.

10. A system for sensing an unknown charge representative of first and second digits stored in a charge storage medium having a given high charge state comprising
    a charge detecting circuit having first and second storage mediums and means including a floating gate sensor for comparing relative amounts of charge in said first and second storage mediums, means for transferring said unknown charge into said first storage medium, means for introducing charge into said charge storage medium to said high charge state, charge dividing means for forming fractional packets of charge of said high state charge, means for transferring said high state charge to said charge dividing means, means for transferring a first given fractional packet of charge from said charge dividing means to said second storage medium in said charge detecting circuit, and means for transferring a second given fractional packet of charge from said charge dividing means to one of said first and second storage mediums of said charge detecting circuit depending upon the relative value of said unknown charge to said first given fractional packet of charge.

11. A system as set forth in claim 10 wherein said floating gate sensor includes a semiconductor substrate and a storage electrode insulated from said substrate and said comparing means further includes a sense amplifier having an input connected to said storage electrode.

12. A system as set forth in claim 11 wherein said second fractional packet transferring means includes a true-complement generator having an input coupled to the output of said sense amplifier and an output coupled to said first fractional packet transferring means.

13. A system as set forth in claim 12 wherein said true-complement generator output is further coupled to said charge introducing means.

14. A system as set forth in claim 13 wherein said unknown charge transferring means includes a charge integrator.

15. A system as set forth in claim 14 wherein said charge introducing means is a driver circuit coupled to said integrator.

16. A system as set forth in claim 15 wherein said high state charge transferring means includes a first charge diverter.

17. A system as set forth in claim 16 wherein said first fractional packet transferring means includes a second charge diverter.

18. A system comprising a memory array including a bit/sense line and a storage capacitor coupled to said bit/sense line, a charge integrator coupled to said bit/sense line, a charge divider, first and second charge diverters, said first charge diverter having an input connected to the output of said charge integrator, a first output connected directly to the input of said second charge diverter and a second output connected to the input of said second charge diverter through said charge divider, a signal detecting circuit coupled to the output of said second charge diverter including a floating gate sensor, a sense amplifier and a true-complement generator, and a bit driver coupled to said bit/sense line through said integrator.

19. A system as set forth in claim 18 wherein said sense amplifier has an input coupled to the output of said floating gate sensor and an output coupled to the input of said true-complement generator.

20. A system as set forth in claim 19 wherein said floating gate sensor includes a semiconductor substrate and a storage electrode insulated from said substrate connected to the input of said sense amplifier and the output of said true-complement generator is coupled to said second charge diverter and to an input of said bit driver.

21. A system as set forth in claim 20 wherein said floating gate sensor further includes first and second storage electrode means for forming first and second potential wells and means for selectively coupling said first and second potential wells to said storage electrode.

* * * * *